(12) United States Patent
Jain et al.

(10) Patent No.: US 7,324,932 B2
(45) Date of Patent: *Jan. 29, 2008

(54) VIRTUAL TEST ENVIRONMENT

(75) Inventors: Sunil K. Jain, Folsom, CA (US); Gregory P. Chema, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 110 days.

This patent is subject to a terminal disclaimer.

(21) Appl. No.: 11/169,597

(22) Filed: Jun. 28, 2005

(65) Prior Publication Data

US 2005/0240389 A1  Oct. 27, 2005

Related U.S. Application Data

(63) Continuation of application No. 09/820,896, filed on Mar. 30, 2001, now Pat. No. 6,934,670.

(51) Int. Cl.
*G06F 17/50* (2006.01)

(52) U.S. Cl. ............................. 703/14; 703/19; 703/13; 703/15; 716/6; 714/726; 714/731; 714/815

(58) Field of Classification Search .................. 703/14, 703/28, 13, 15, 23; 716/6; 714/726, 731; 714/815; 438/14
See application file for complete search history.

(56) References Cited

U.S. PATENT DOCUMENTS

| | | | |
|---|---|---|---|
| 5,872,952 A | 2/1999 | Tuan et al. | |
| 5,931,962 A | 8/1999 | Dang | |
| 6,197,605 B1 | 3/2001 | Simunic et al. | |
| 6,370,675 B1 | 4/2002 | Matsumura et al. | |
| 6,470,482 B1 | 10/2002 | Rostoker et al. | |
| 6,550,036 B1 | 4/2003 | Panis | |
| 6,678,643 B1 | 1/2004 | Turnquist et al. | |
| 6,704,895 B1 | 3/2004 | Swoboda et al. | |
| 2002/0049554 A1 | 4/2002 | Miller | |

*Primary Examiner*—K Thangavelu
(74) *Attorney, Agent, or Firm*—Molly A. McCall

(57) ABSTRACT

A method of and an apparatus for designing a test environment providing reliable test signal integrity, and of evaluating performance of the test environment and an electronic device during testing of the electronic device. A virtual test environment is created emulating an actual test environment in which the electronic device is to be tested. A virtual calibration of the virtual test environment may be performed, to more closely emulate the actual test environment. A virtual device emulating the actual electronic device is implanted into the virtual test environment, and that virtual device is stimulated with an input test signal emulating the actual input signal that is applied to the actual electronic device in the actual test environment. The integrity of the input test signal and the resulting output signal is evaluated. Based on that evaluation an adjustment might be made to the virtual calibration of the virtual test environment and/or to the virtual device, or both, and the design of the actual device might be improved. The invention can be implemented on a properly programmed general purpose processing system or on a special purpose system.

16 Claims, 3 Drawing Sheets

VIRTUAL TEST ENVIRONMENT

CROSS REFERENCE TO RELATED APPLICATIONS

This application is a continuation of U.S. application Ser. No. 09/520,396, filed on Mar. 30, 2001 by inventors Sunil K. Jain and Gregory P. Chema, now U.S. Pat. No. 6,934,670, entitled "Virtual Test Environment", and priority is claimed thereto.

FIELD

The present invention pertains to designing of a test environment providing reliable test signal integrity during testing of electronic devices, and to evaluating the performance of the test environment and of an electronic device during testing of the electronic device

BACKGROUND

The designing of an electronic device such as an integrated circuit chip is a complex, time consuming, and consequently costly procedure. The device design is frequently tested at various points during the design and implementation process to be certain that the device will perform as desired. In addition, during high volume manufacturing of the device, each unit of the device must be tested to be certain it is acceptable. The ultimate performance of the electronic device, however, is as a part of an overall system. In such use, the electronic device is generally mounted on a circuit board, such as a motherboard, and is electrically connected to other components on the circuit board. To test the device an input signal might be applied that simulates the input signal which the device is to receive during its regular operation on the circuit board, and the resulting output signal is monitored to see how it compares with the output signal that should be obtained during that regular operation. However, during the testing the input signal is provided by, and the output signal is applied to, test equipment, and not by and to other circuit components on the motherboard. That test equipment generally includes a general purpose tester and a tester interface unit that is designed for use with the specific electronic device under test. Even though the test equipment is designed to emulate the other circuit components on the motherboard, that emulation is not total. By way of example, signal propagation times are different. Output impedances, particularly, capacitances, may differ. In general, the integrity of the input and output signals is different during testing as compared with during actual use. As a result, performance on the test equipment does not accurately emulate the performance on the motherboard. This problem is exacerbated when there are multiple types of electronic devices, and so multiple types of inputs and outputs on the circuit board.

SUMMARY

The present invention is a method of and an apparatus for designing a test environment providing reliable test signal integrity, and of evaluating performance of the test environment and of an electronic device during testing of the electronic device. In accordance with the present invention, a virtual test environment is created emulating the actual test environment in which the electronic device is to be tested. A virtual device emulating the actual electronic device is implanted into the virtual test environment, and that virtual device is stimulated with an input test signal emulating the actual input signal that is applied to the actual device by the actual test equipment. The integrity of the input test signal and the resulting virtual device output signal is evaluated. The invention can be implemented on a properly programmed general purpose processing system or on a special purpose system.

BRIEF DESCRIPTION OF THE DRAWING(S)

These and other aspects and advantages of the present invention are more apparent from the following detailed description and claims, particularly when considered in conjunction with the accompanying drawings. In the drawings:

DETAILED DESCRIPTION

Figure 1:
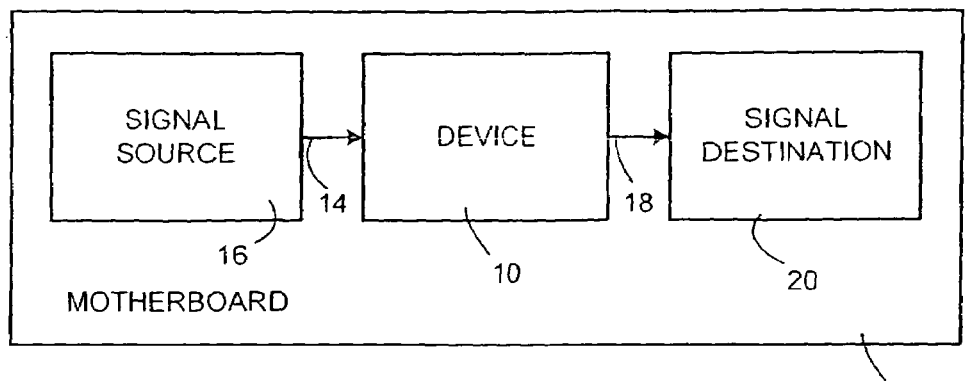
FIG. 1 is a block diagram illustrating an electronic device in use.
Figure 2:
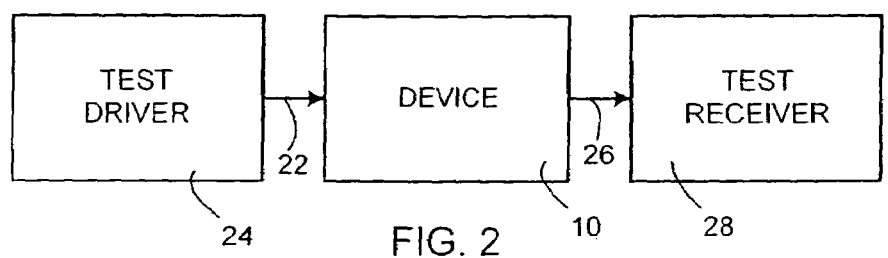
FIG. 2 is a block diagram illustrating the testing of an electronic device.

FIG. 1 illustrates an electronic device 10 in an environment in which it might ordinarily be used. In the illustrative example of FIG. 1, electronic device 10 is mounted on motherboard 12 to receive an input signal via connection 14 from a signal source 16 and to apply an output signal via connection 18 to signal destination 20. Electronic device 10 might be an integrated circuit chip, for example. In designing electronic device 10, the expected input signal from signal source 16 and the desired output signal to signal destination 20 are utilized to determine the characteristics to be designed into device 10. At various stages during the design process, it may be desirable to test the design of device 10. In addition, during high volume manufacturing of electronic device 10, acceptance testing of each manufactured device is preferably performed. FIG. 2 illustrates the testing of an electronic device 10 which might be an electronic device undergoing design evaluation or a manufactured device undergoing acceptance testing. The device 10 receives an input test signal on line 22 from test driver 24 and provides an output test signal on line 26 to test receiver 28. The input test signal from test driver 24 emulates the input signal from signal source 16, and the resulting output test signal applied to test receiver 28 should emulate the output signal applied by device 10 to signal destination 20. The output test signal is evaluated to determine whether device 10 is acceptable.

Figure 3:
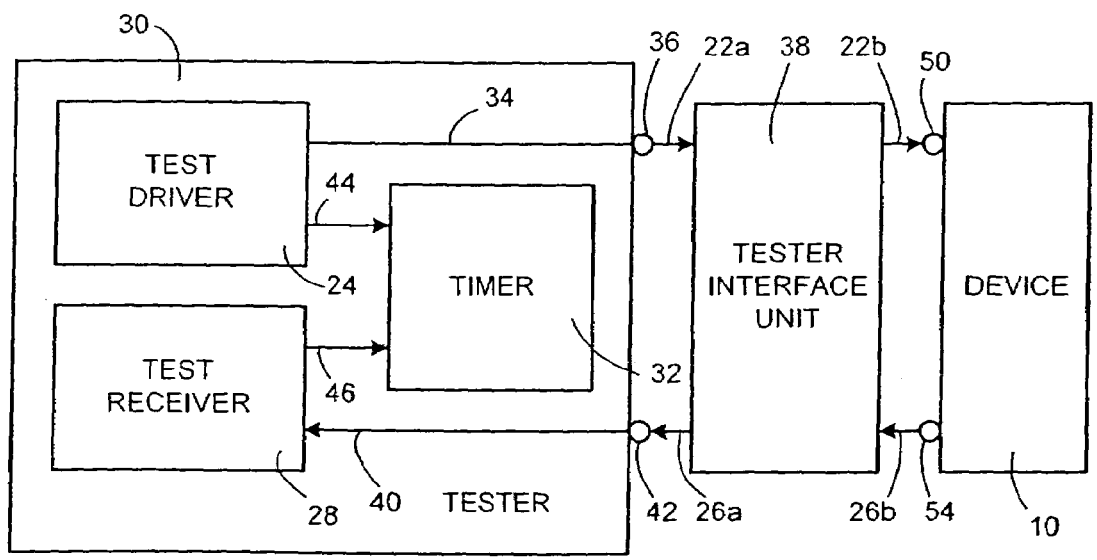
FIG. 3 is a block diagram of a conventional test environment for an electronic device.

FIG. 3 is a block diagram of a conventional test environment for an electronic device such as device 10. Tester 30 includes test driver 24, test receiver 28, and timer 32. Test driver 24 is connected by line 34 to output connector 36, which is connected by line 22a to tester interface unit 38. Test receiver 28 is connected by line 40 to input connector 42, which is connected to tester interface unit 38 by line 26a.

Timer 32 is connected to test driver 24 by line 44 and to test receiver 28 by line 46. Connectors 36 and 42 are preferably spring biased connector pins. Tester interface unit 38, in turn, is connected by line 22b to input connector 50 of the device under test 10 and by line 26b to output connector 54 of device 10.

Test driver 24 applies an input test signal via line 34, connector 36, and line 22a to tester interface unit 38 which applies the signal via line 22b to input connector 50 of the device under test 10. The resulting output signal from device 10 is applied via connector 54 and line 26b to tester interface unit 38 which applies the output signal via line 26a, connector 42, and line 40 to test receiver 28. Tester interface unit 38 is designed to permit a general purpose tester 30 to test various electronic devices of different designs, as in well known in the art.

When a device 10 is to be tested, test driver 24 applies an input test signal to the device under test 10 and applies a signal on line 44 to start timer 32. The resulting output test signal from device under test 10 is applied to test receiver 28, and the test receiver then applies a signal on line 46 to stop timer 32. FIG. 3 depicts tester 30 testing a single device 10. In practice, tester 30 has a large number of test channels, for example 512 test channels, enabling the tester to test a large number of devices at the same time, including devices of various types.

On motherboard 12, the length of the signal paths 14 and 18 between signal source 16 and signal destination 20, and through device 10 is less than the length of the signal paths 22a, 22b and 26b, 26a between test driver 24 and test receiver 28 and through tester interface unit 38 and device 10. Consequently, more time elapses between initiation of the input test signal by test driver 24 and receipt of the output test signal by test receiver 28 than between initiation of the input signal by signal source 16 and receipt of the output signal by signal destination 20. Timer 32 shows this greater period of time. In addition, capacitances and inductances of the test arrangement of FIG. 3 differ from those of the operational arrangement of FIG. 1, affecting the signal rise and decay times. Further, technology advances have resulted in numerous electronic devices such as device 10 having faster speeds than test equipment such as tester 30. These higher speeds also bring into consideration transmission line effects, skin effects, and wave effects which are not accommodated by many present day pieces of test equipment. Thus, tester 30 does not provide an accurate test of the device 10 the operational environment of the device.

Figure 4:
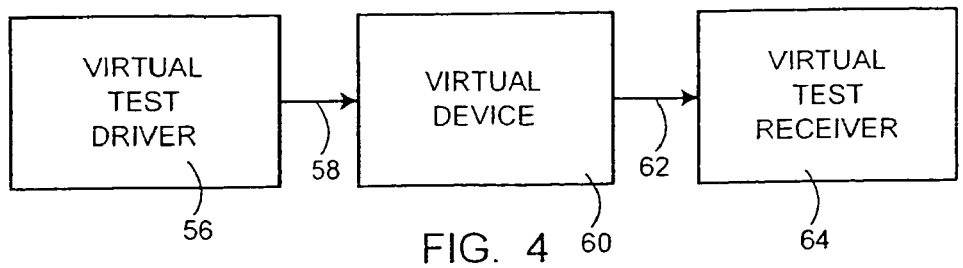
FIG. 4 is a block diagram illustrating the testing of a virtual electronic device in accordance with a preferred embodiment of the present invention.

FIG. 4 illustrates a virtual test driver 56 applying an input test signal via line 58 to a virtual electronic device 60. Virtual electronic device 60 applies an output test signal via line 62 to virtual test receiver 64. The arrangement of FIG. 4 can be implemented on a properly programmed processing system, with the result that the lengths and characteristics of leads 58 and 62 can be made to accurately reflect the length and characteristics of the leads 14 and 18 on motherboard 12. Virtual test driver 56 and virtual test receiver 64 emulate test driver 24 and test receiver 28, respectively, as well as tester interface unit 38, while virtual device 60 emulates electronic device 10.

Figure 5:
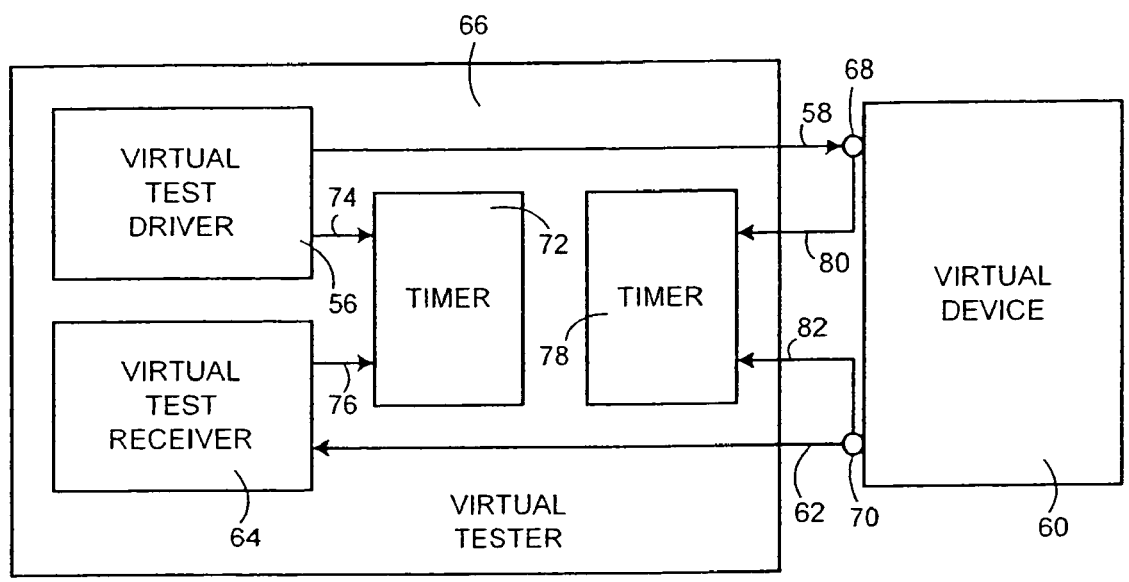
FIG. 5 is a block diagram of a preferred embodiment of a virtual test environment in accordance with the present invention.

FIG. 5 is a detailed block diagram of a virtual tester 66 coupled to a virtual electronic device 60 in accordance with a preferred embodiment of the present invention. Virtual tester 66 includes virtual test driver 56 which is coupled by connection 58 to input terminal 68 of virtual electronic device 60. Virtual tester 54 also includes virtual test receiver 64 which is coupled by connection 62 to output terminal 70 of virtual electronic device 60. In addition, virtual tester 60 includes a first timer 72 which is connected to virtual test driver 56 by line 74 and is connected to virtual test receiver 64 by line 76. Further, virtual tester 66 includes a second timer 78 which is connected to input terminal 68 of virtual electronic device 60 by connection 80 and is connected to output terminal 70 of virtual electronic device 60 by connection 82.

When virtual test driver 56 sends an input test signal to input connector 68 of virtual electronic device 60, the test driver also sends a signal on line 74 to start first timer 72. When the input test signal is applied from connector 68 to virtual device 60, a signal is applied from connector 68 to start second timer 78. When virtual device 60 applies an output signal to output connector 70, that output signal is applied by line 62 to virtual test receiver 64, and a signal is applied on line 82 to stop second timer 78. When the output signal is received by virtual test receiver 64, the virtual test receiver applies a signal on line 76 to stop first timer 72.

Connection 58 from virtual test driver 56 to connector 68 of virtual device 60 emulates connections 22a and 22b and through tester interface unit 38 between test driver 24 and electronic device under test 10. Likewise, connection 62 from connector 70 to virtual test receiver 64 emulates connection 26b and 26a and through tester interface unit 38 between device 10 and test receiver 28. Consequently, timer 72 provides readings corresponding with those of timer 32. Connectors 68 and 70 and connections 80 and 82 which couple virtual device 60 to timer 78 emulate connections 14 and 18 between signal source 16 and device 10 and between device 10 and signal destination 20 on motherboard 12. Consequently, timer 78 provide indications of signal transmission times corresponding with those experienced by device 10 on motherboard 12.

Figure 6:
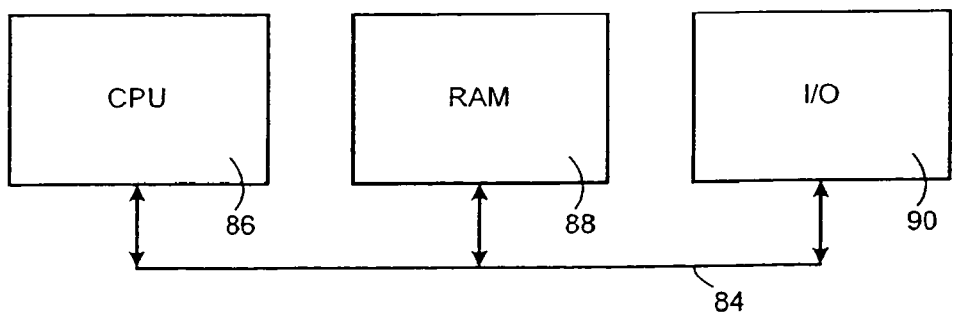
FIG. 6 is a block diagram of apparatus implementing the invention.

FIG. 6 is an overall block diagram of apparatus in the form of a properly programmed general purpose processing system for implementing the invention. Bus 84 interconnects central processing unit 86, memory 88, and input/output unit 90. Memory 88 can be a random access memory, for example. Input/output unit 90 is used to specify the type and characteristics of tester 30, tester interface unit 38, and electronic device 10 to be emulated, and thus the characteristics of virtual tester 66 and virtual device 60. Input/output unit 90 then initiates the virtual test and receives time signal outputs from timers 72 and 78. Based on those outputs, the characteristics of virtual tester 66 and/or virtual device 60 are adjusted. In addition, design of the actual device can be improved. Once satisfactory results, emulating the output expected from electronic device 10, are obtained, the characteristics are utilized in the design of electronic device 10 and/or tester interface unit 38.

Figure 7:
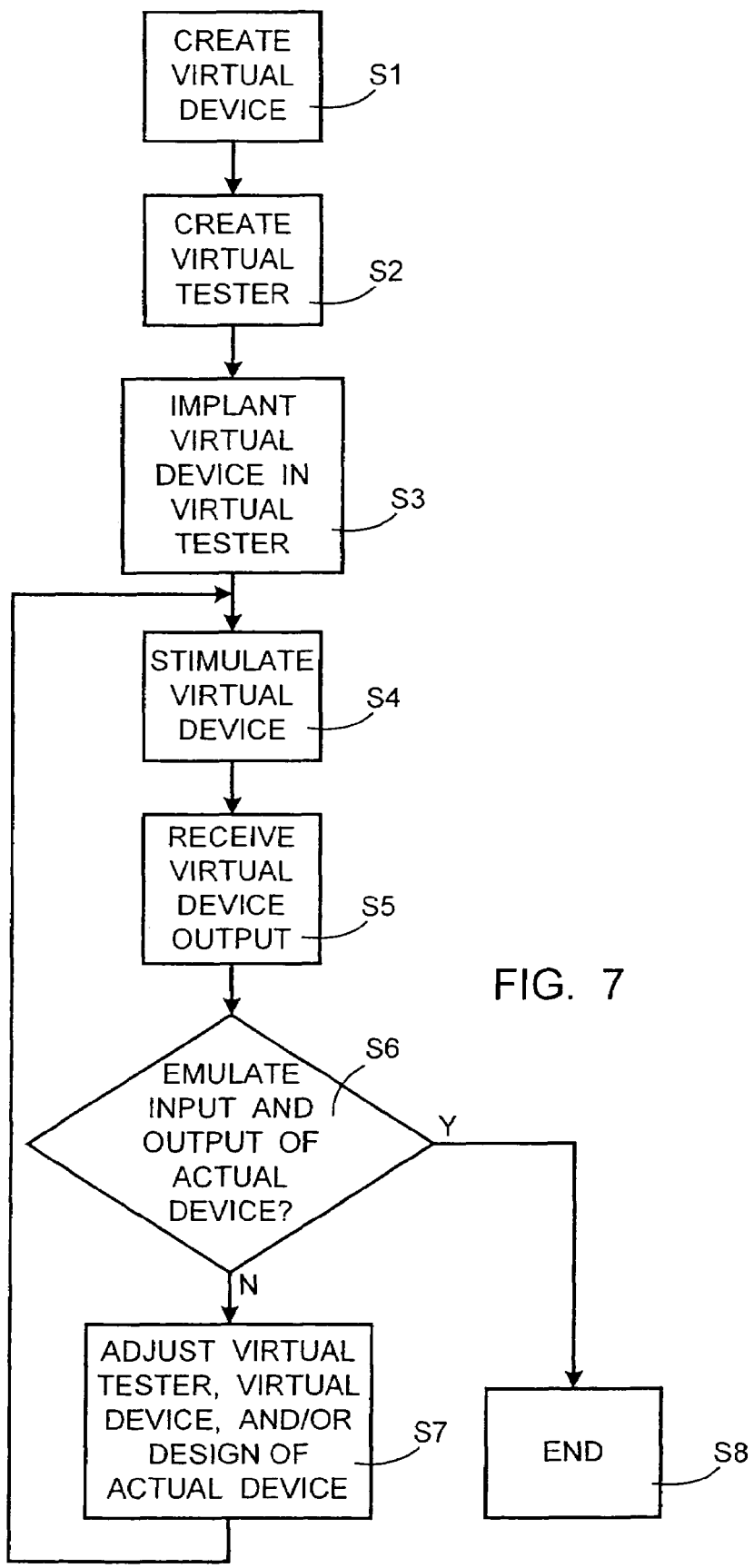
FIG. 7 is a flowchart of a preferred embodiment of a method in accordance with the present invention.

FIG. 7 is a flowchart of a preferred embodiment of a method of evaluating the performance of a tester for testing an electronic device in accordance with the present invention. In a step S1, a virtual electronic device, emulating the actual electronic device, is created, and in a step S2 a virtual tester, emulating the actual tester, is created. In step S3 the virtual electronic device is implanted in the virtual tester. In step S4 the virtual electronic device is stimulated with an input test signal emulating the test signal of the actual tester. Then in step S5 the output from the virtual electronic device is received, and in step S6 the input and output are evaluated to determine whether they in fact emulate the expected input and output of the actual electronic device 10. If not, then in step S7 the virtual tester or the virtual device, or both, are adjusted, and/or the design of the actual device is improved and the process returns to step S4. By way of example the calibration of the virtual tester might be improved based on the evaluation. Once it is determined in step S6 that the virtual device input and output satisfactorily emulate the actual device input and output, the process ends in step S8. The resulting characteristics of the virtual tester can then be used in designing a tester interface unit for use with the actual electronic device 10.

It is thus seen that in accordance with the present invention, it is possible to design test equipment that more satisfactorily tests an electronic device both during the design process, so as to more accurately achieve the desired device characteristics, and during acceptance testing of high volume manufacturing. Although the present invention has been described with reference to preferred embodiments, various alterations, rearrangements, and substitutions might be made, and still the result will be within the scope of the invention.

The invention claimed is:

1. A computer implemented method for designing a tester interface unit for use with an actual electronic device, comprising:
   simulating a virtual device with an input test signal emulating an actual input signal to be applied to the actual electronic device during testing;
   determining, in a virtual test environment, an indication of a signal transmission time of the actual electronic device in an actual test environment;
   determining, in the virtual test environment, an indication of a signal transmission time of the actual electronic device in the environment where the actual electronic device will ordinarily be used;
   evaluating the integrity of the input test signal and a resulting output signal from the virtual device based on the determined indication of the signal transmission time of the actual electronic device in the actual test environment and the determined indication of the signal transmission time of the actual electronic device in the environment where the actual electronic device will ordinarily be used; and
   using the evaluation of the integrity of the input test signal and the resulting output signal from the virtual device to design the tester interface unit for use with the actual electronic device.

2. The computer implemented method of claim 1, further comprising performing a virtual calibration of the virtual test environment.

3. The computer implemented method of claim 2, further comprising improving the virtual calibration based on the evaluation.

4. The computer implemented method of claim 1, further comprising performing a virtual adjustment of the virtual device based on the evaluation.

5. The computer implemented method of claim 1, further comprising improving the design of the actual electronic device based on the evaluation.

6. An apparatus for designing a tester interface unit for use with an actual electronic device, comprising:
   a general purpose processing system;
   a virtual test environment simulating a virtual device with an input test signal emulating an actual input signal to be applied to the actual electronic device during testing; and
   virtual timing circuitry determining an indication of a signal transmission time of the actual electronic device in an actual test environment and determining an indication of a signal transmission time of the actual electronic device in the environment where the actual electronic device will ordinarily be used,
   wherein the determined indication of the signal transmission time of the actual electronic device in the actual test environment and the determined indication of the signal transmission time of the actual electronic device in the environment where the actual electronic device will ordinarily be used are used to evaluate the integrity of the input test signal and a resulting output test signal from the virtual device,
   wherein the evaluation of the integrity of the input test signal and the resulting output test signal from the virtual device is used to design the tester interface unit for use with the actual electronic device.

7. The apparatus of claim 6, wherein said virtual test environment emulates a general purpose tester and a tester interface unit specific to the actual electronic device.

8. The apparatus of claim 6, wherein said virtual timing circuitry comprises a first timer to determine a time interval between output of the input test signal by said virtual test environment and receipt of the output test signal by said virtual test environment, and a second timer to determine a time interval between receipt of the input test signal by said virtual device and output of the output test signal by said virtual device.

9. The apparatus of claim 6, wherein said virtual test environment comprises a virtual test driver to apply the input test signal to said virtual device, and a virtual test receiver to receive the output test signal from said virtual device.

10. The apparatus of claim 9, wherein said virtual timing circuitry comprises a first timer to determine the time interval between output of the input test signal by said virtual test driver and receipt of the output test signal by said virtual test receiver, and a second timer to determine the time interval between receipt of the input test signal by said virtual device and output of the output test signal by said virtual device.

11. The apparatus of claim 9, wherein said virtual timing circuitry comprises a first timer to determine the time interval between output of the input test signal by said virtual test environment and receipt of the output test signal by said virtual test environment, and a second timer to determine the time interval between receipt of the input test signal by said virtual device and output of the output test signal by said virtual device.

12. A machine-readable storage medium containing instructions which, when executed by a processing system, cause the processing system to perform a method for designing a tester interface unit for use with an actual electronic device, the medium comprising instructions for:
   simulating a virtual device with an input test signal emulating an actual input signal to be applied to the actual electronic device during testing;
   determining, in a virtual test environment, an indication of a signal transmission time of the actual electronic device in an actual test environment;
   determining, in the virtual test environment, an indication of a signal transmission time of the actual electronic device in the environment where the actual electronic device will ordinarily be used;
   evaluating the integrity of the input test signal and a resulting output signal from the virtual device based on the determined indication of the signal transmission time of the actual electronic device in the actual test environment and the determined indication of the signal transmission time of the actual electronic device in the environment where the actual electronic device will ordinarily be used; and using the evaluation of the integrity of the input test signal and the resulting output signal from the virtual device to design the tester interface unit for use with the actual electronic device.

13. The machine-readable storage medium of claim 12, further comprising instructions for performing a virtual calibration of the virtual test environment.

14. The machine-readable storage medium of claim 13, further comprising instructions for improving the virtual calibration based on the evaluation.

15. The machine-readable storage medium of claim 12, further comprising instructions for performing a virtual adjustment of the virtual device based on the evaluation.

16. The machine-readable storage medium of claim 12, further comprising instructions for improving the design of the actual electronic device based on the evaluation.

* * * * *